United States Patent
Yamazaki

(10) Patent No.: US 11,309,161 B2
(45) Date of Patent: Apr. 19, 2022

(54) CHARGED PARTICLE BEAM APPARATUS AND ADJUSTMENT METHOD FOR CHARGED PARTICLE BEAM APPARATUS

(71) Applicant: JEOL Ltd., Tokyo (JP)

(72) Inventor: Kazuya Yamazaki, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/155,308

(22) Filed: Jan. 22, 2021

(65) Prior Publication Data
US 2021/0233739 A1    Jul. 29, 2021

(30) Foreign Application Priority Data
Jan. 23, 2020 (JP) .............................. JP2020-009014

(51) Int. Cl.
*H01J 37/20* (2006.01)
*H01J 37/18* (2006.01)
(Continued)

(52) U.S. Cl.
CPC .............. *H01J 37/20* (2013.01); *H01J 37/18* (2013.01); *H01J 37/244* (2013.01);
(Continued)

(58) Field of Classification Search
CPC .. H01J 37/00; H01J 37/02; H01J 37/20; H01J 37/18; H01J 37/244; H01J 37/265;
(Continued)

(56) References Cited

U.S. PATENT DOCUMENTS

| 6,067,164 A | 5/2000 | Onoguchi et al. |
| 6,310,341 B1 | 10/2001 | Todokoro et al. |

(Continued)

FOREIGN PATENT DOCUMENTS

| GB | 2484197 A | 4/2012 |
| JP | 1092354 A | 4/1998 |
| JP | 200773380 A | 3/2007 |

OTHER PUBLICATIONS

Extended European Search Report issued in EP21150410.5 dated Jul. 17, 2021.

(Continued)

*Primary Examiner* — Jason L McCormack
(74) *Attorney, Agent, or Firm* — The Webb Law Firm

(57) ABSTRACT

A charged particle apparatus includes: a specimen chamber which is maintained at vacuum and in which a specimen is disposed; a preliminary exhaust chamber that is connected to the specimen chamber via a vacuum gate valve; an exhaust device that exhausts the preliminary exhaust chamber; charged particle beam source an optical system; a detector; a transporting device that transports the specimen from the preliminary exhaust chamber to the specimen chamber; and a control unit. The control unit performs: adjustment processing in which at least one of the optical system and the detector is adjusted in a state where the specimen is housed in the preliminary exhaust chamber; and transporting processing which is performed after the adjustment processing and in which the vacuum gate valve is opened and the transporting device transports the specimen to the specimen chamber.

3 Claims, 8 Drawing Sheets

(51) Int. Cl.
*H01J 37/244* (2006.01)
*H01J 37/26* (2006.01)
*H01J 37/28* (2006.01)

(52) U.S. Cl.
CPC ............ *H01J 37/265* (2013.01); *H01J 37/28* (2013.01); *H01J 2237/182* (2013.01)

(58) Field of Classification Search
CPC .... H01J 37/28; H01J 37/185; H01J 2237/182; H01J 2237/2485; H01J 2237/184
USPC .......................................... 250/306, 307, 311
See application file for complete search history.

(56) References Cited

U.S. PATENT DOCUMENTS

| | | | | |
|---|---|---|---|---|
| 2002/0050565 A1* | 5/2002 | Tokuda | ................... | H04L 67/16 |
| | | | | 250/310 |
| 2007/0029504 A1* | 2/2007 | Saito | ................. | H01L 21/67748 |
| | | | | 250/442.11 |
| 2008/0203301 A1* | 8/2008 | Saito | ....................... | H01J 37/10 |
| | | | | 250/311 |
| 2013/0284924 A1* | 10/2013 | Mizuochi | ........... | G01N 23/2206 |
| | | | | 250/310 |

OTHER PUBLICATIONS

Extended European Search Report issued in EP21150410.5 dated Jun. 17, 2021.
Office Action issued in JP2020009014 dated Dec. 7, 2021.

* cited by examiner

CHARGED PARTICLE BEAM APPARATUS AND ADJUSTMENT METHOD FOR CHARGED PARTICLE BEAM APPARATUS

CROSS-REFERENCE TO RELATED APPLICATION

This application claims priority to Japanese Patent Application No. 2020-009014 filed Jan. 23, 2020, the disclosure of which is hereby incorporated by reference in its entirety.

BACKGROUND OF THE INVENTION

Field of the Invention

The invention relates to a charged particle beam apparatus and an adjustment method for a charged particle beam apparatus.

Description of Related Art

In an electron microscope, such as a transmission electron microscope and a scanning electron microscope, an optical system and a detector are adjusted before observing and analyzing a specimen (see JP-A-10-92354, for example).

In a case of observing a specimen using a transmission electron microscope, for example, the specimen held on a specimen holder is loaded into a specimen chamber, and then the optical system and the detector are adjusted.

Specifically, the specimen is set on the specimen holder. Then the specimen holder on which the specimen is set is loaded into a preliminary exhaust chamber, and the preliminary exhaust chamber is exhausted using a vacuum exhaust system (preliminary exhaust). A user confirms that the pressure inside the preliminary exhaust chamber reached a predetermined pressure, then opens a gate valve separating the preliminary exhaust chamber and the specimen chamber, and loads the specimen held on the specimen holder into the specimen chamber.

After the specimen is loaded into the specimen chamber, irradiation with an electron beam is started. Then the optical system and the detector are adjusted. Examples of the adjustment performed here are: adjustment of the position of the electron beam with respect to an irradiation optical system; adjustment of the position of the electron beam with respect to an imaging system; adjustment of the position of the aperture of the irradiation system; adjustment of the position of the aperture of the imaging system; and adjustment of the detector, which includes a confirmation of the state of the detector whether the detector is accurately detecting the electron beam.

After the optical system and the detector are adjusted, observation and analysis of the specimen are enabled.

As described above, in the case of a charged particle beam apparatus, such an electron microscope, the preliminary exhaust, adjustment of the optical system and the detector, and the like, must be performed in a period from setting a specimen on the specimen holder to performing observation and analysis of the specimen. Therefore a charged particle beam apparatus, which can quickly perform observation and analysis of a specimen, is demanded.

SUMMARY OF THE INVENTION

According to a first aspect of the invention, there is provided a charged particle beam apparatus including:

a specimen chamber which is maintained at vacuum and in which a specimen is disposed;

a preliminary exhaust chamber that is connected to the specimen chamber via a vacuum gate valve;

an exhaust device that exhausts the preliminary exhaust chamber;

a charged particle beam source;

an optical system;

a detector;

a transporting device that transports the specimen from the preliminary exhaust chamber to the specimen chamber; and a control unit that controls the exhaust device, the optical system, the detector and the transporting device, wherein the control unit performs:

adjustment processing in which at least one of the optical system and the detector is adjusted in a state where the specimen is housed in the preliminary exhaust chamber; and transporting processing which is performed after the adjustment processing and in which the vacuum gate valve is opened and the transporting device transports the specimen to the specimen chamber.

According to a second aspect of the invention, there is provided an adjustment method for a charged particle beam apparatus which includes:

a specimen chamber which is maintained at vacuum and in which a specimen is disposed;

a preliminary exhaust chamber that is connected to the specimen chamber via a vacuum gate valve;

an exhaust device that exhausts the preliminary exhaust chamber;

a charged particle beam source an optical system;

a detector; and a transporting device that transports the specimen from the preliminary exhaust chamber to the specimen chamber, the adjustment method including:

an adjustment step in which at least one of the optical system and the detector is adjusted in a state where the specimen is housed in the preliminary exhaust chamber; and a transporting step which is performed after the adjustment step and in which the vacuum gate valve is opened and the specimen is transported to the specimen chamber.

DESCRIPTION OF THE INVENTION

Figure 1:
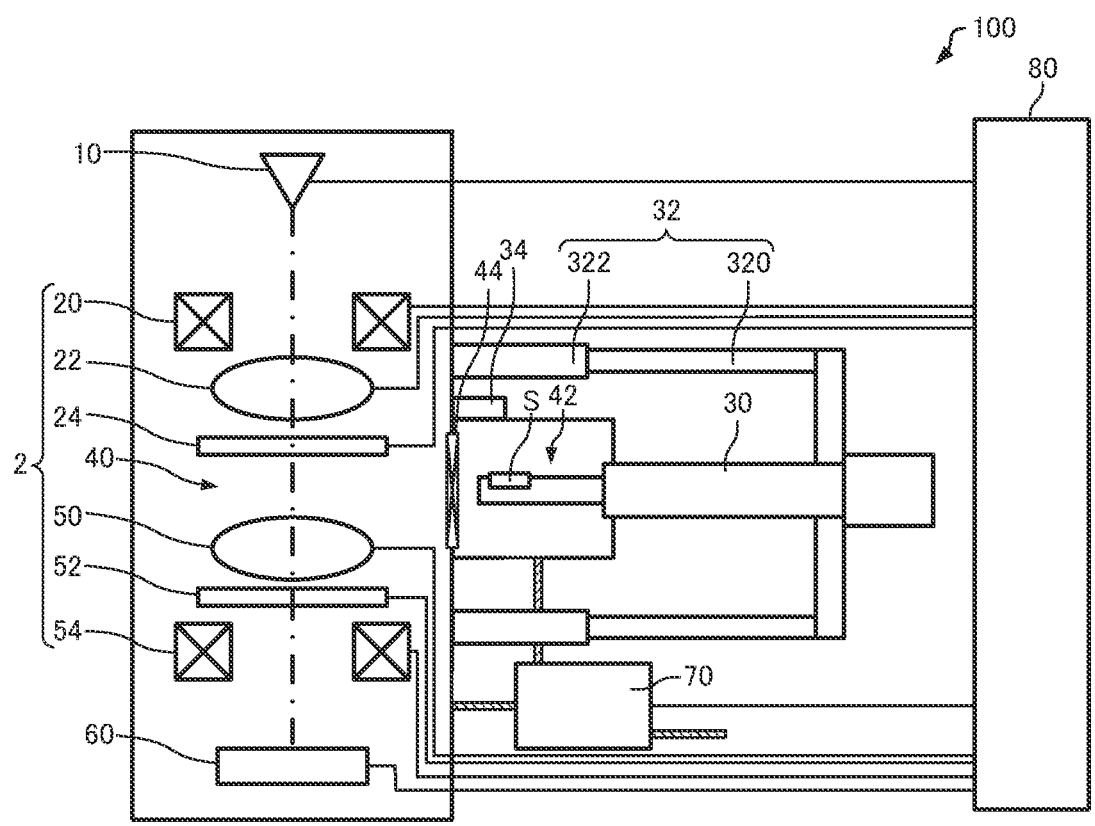
FIG. 1 is a diagram illustrating a configuration of an electron microscope according to the first embodiment.

According to an embodiment of the invention, there is provided a charged particle beam apparatus including:

a specimen chamber which is maintained at vacuum and in which a specimen is disposed;

a preliminary exhaust chamber that is connected to the specimen chamber via a vacuum gate valve;

an exhaust device that exhausts the preliminary exhaust chamber;

a charged particle beam source;

an optical system;

a detector;

a transporting device that transports the specimen from the preliminary exhaust chamber to the specimen chamber; and a control unit that controls the exhaust device, the optical system, the detector and the transporting device, wherein the control unit performs:

adjustment processing in which at least one of the optical system and the detector is adjusted in a state where the specimen is housed in the preliminary exhaust chamber; and transporting processing which is performed after the adjustment processing and in which the vacuum gate valve is opened and the transporting device transports the specimen to the specimen chamber.

According to this charged particle beam apparatus, the adjustment processing can be performed while a specimen is housed in the preliminary exhaust chamber, hence observation and analysis can be performed quickly after the specimen is loaded into the specimen chamber.

According to an embodiment of the invention, there is provided an adjustment method for a charged particle beam apparatus which includes:

a specimen chamber which is maintained at vacuum and in which a specimen is disposed;

a preliminary exhaust chamber that is connected to the specimen chamber via a vacuum gate valve;

an exhaust device that exhausts the preliminary exhaust chamber;

a charged particle beam source;

an optical system;

a detector; and a transporting device that transports the specimen from the preliminary exhaust chamber to the specimen chamber, the adjustment method including:

an adjustment step in which at least one of the optical system and the detector is adjusted in a state where the specimen is housed in the preliminary exhaust chamber; and a transporting step which is performed after the adjustment step and in which the vacuum gate valve is opened and the specimen is transported to the specimen chamber.

According to this adjustment method for the charged particle beam apparatus, the adjustment step can be performed while a specimen is housed in the preliminary exhaust chamber, hence observation and analysis can be performed quickly after the specimen is loaded into the specimen chamber.

Preferred embodiments of the invention will now be described in detail with reference to the drawings. It should be noted that the following embodiments do not unduly limit the scope of the invention as stated in the claims. In addition, all of the elements described in the following embodiments are not necessarily essential requirements of the invention.

In the following embodiments, an electron microscope that observes a specimen by irradiating the specimen with an electron beam will be described as an example of the charged particle beam apparatus according to the invention, but the charged particle beam apparatus according to the invention may be an apparatus that observes a specimen by irradiating the specimen with a charged particle beam (e.g. ion beam) other than an electron beam.

1. First Embodiment

1.1. Electron Microscope

Figure 2:
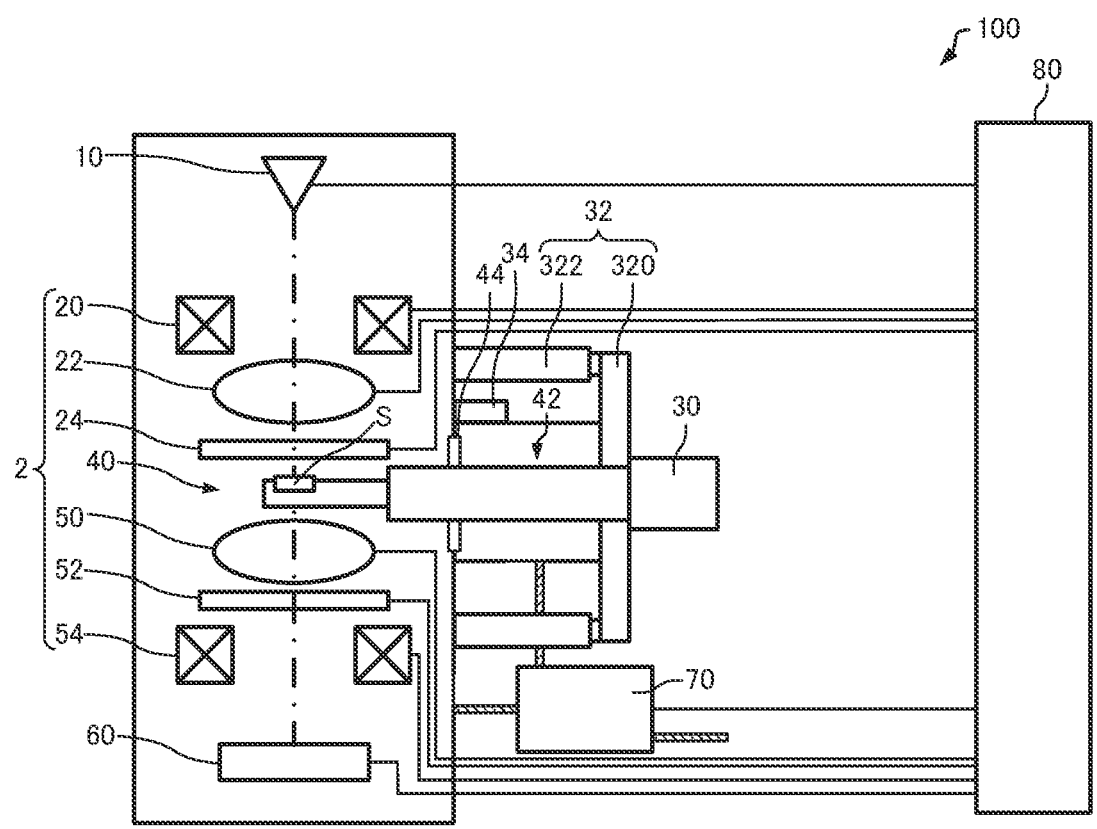
FIG. 2 is a diagram illustrating a configuration of an electron microscope according to the first embodiment.

An electron microscope according to the first embodiment will be described with reference to the drawings. FIG. 1 and FIG. 2 are diagrams illustrating a configuration of an electron microscope 100 according to the first embodiment. FIG. 1 indicates a state where a specimen S is positioned in a preliminary exhaust chamber 42, and FIG. 2 indicates a state where the specimen S is positioned in a specimen chamber 40.

The electron microscope 100 is a transmission electron microscope. As illustrated in FIG. 1 and FIG. 2, the electron microscope 100 includes an electron beam source 10 (an example of the charged particle beam source), an irradiation system deflector 20, an irradiation optical system 22, an irradiation system aperture device 24, a specimen holder 30, a specimen holder transporting device 32 (an example of the transporting device), a specimen holder driving device 34, the specimen chamber 40, the preliminary exhaust chamber 42, a vacuum gate valve 44, an imaging optical system 50, an imaging system aperture device 52, an imaging system deflector 54, a detector 60, an exhaust device 70 and a control unit 80.

The electron beam source 10 emits an electron beam (an example of the charged particle beam). For example, the electron beam source 10 is an electron gun which accelerates electrons emitted from the cathode toward the anode and emits the electron beam.

The irradiation system deflector 20, the irradiation optical system 22, the irradiation system aperture device 24, the imaging optical system 50, the imaging system aperture device 52 and the imaging system deflector 54 constitute an optical system 2. The optical system 2 is housed in a lens barrel of the electron microscope 100.

The irradiation system deflector 20 deflects an electron beam emitted from the electron beam source 10. The irradiation system deflector 20 guides the electron beam onto the specimen S.

The irradiation optical system 22 irradiates the specimen S with the electron beam emitted from the electron beam source 10. The irradiation optical system 22 includes a plurality of focusing lenses, for example.

The irradiation system aperture device 24 includes an aperture that cuts off unnecessary electron beams from the electron beams emitted from the electron beam source 10. The aperture of the irradiation system aperture device 24 includes aperture holes having different diameters. The irradiation system aperture device 24 includes a driving mechanism that moves the aperture, and the aperture hole can be switched by operating the driving mechanism. By switching the aperture holes, an aperture angle of the electron beam and irradiation dose of the electron beam can be adjusted. In the irradiation system aperture device 24, the aperture can be moved out of the optical axis by operating the driving mechanism.

The specimen holder 30 holds the specimen S. The specimen holder 30 is set in the specimen holder transporting device 32.

The specimen holder transporting device 32 transports the specimen holder 30. By transporting the specimen holder 30, the specimen holder transporting device 32 can move the specimen S held on the specimen holder 30 between the preliminary exhaust chamber 42 and the specimen chamber 40. The specimen holder transporting device 32 includes a support unit 320 that supports the specimen holder 30, and a driving unit 322 that moves the support unit 320. The driving unit 322 is an actuator, such as an air cylinder, for example. The specimen holder transporting device 32 functions as a transporting device that transports the specimen S from the preliminary exhaust chamber 42 to the specimen chamber 40.

The specimen holder driving device 34 moves the specimen holder 30. The specimen S can be moved by operating the specimen holder driving device 34 in a state where the specimen holder 30 is inserted into the specimen chamber 40, and the specimen S is positioned in the specimen chamber 40. Thereby the observation field of view can be moved.

The specimen chamber 40 is a space inside the lens barrel of the electron microscope 100. The specimen chamber 40 is exhausted by the exhaust device 70 so as to maintain the chamber at vacuum. The specimen chamber 40 is a space in which the specimen S held on the specimen holder 30 is disposed. In the specimen chamber 40, the specimen S is irradiated with an electron beam.

The preliminary exhaust chamber 42 is connected to the specimen chamber 40 via the vacuum gate valve 44. In other words, the preliminary exhaust chamber 42 and the specimen chamber 40 are separated by the vacuum gate valve 44, and the preliminary exhaust chamber 42 and the specimen chamber 40 are connected by opening the vacuum gate valve 44. The electron microscope 100 includes a vacuum gauge to measure the pressure (degree of vacuum) in the preliminary exhaust chamber 42.

The imaging optical system 50 forms an image of the electron beam transmitted through the specimen S on the detector 60. The imaging optical system 50 includes an objective lens, an intermediate lens and a projection lens, for example.

The imaging system aperture device 52 includes an aperture that cuts unnecessary electron beams from the electron beams transmitted through the specimen S. By the aperture of the imaging system aperture device 52, the scattering range of the electron beams transmitted through the specimen S can be adjusted. The imaging system aperture device 52 includes a driving mechanism that moves the aperture. The imaging system aperture device 52 can move the aperture out of the optical axis by operating the driving mechanism.

The imaging system deflector 54 deflects the electron beam transmitted through the specimen S. The imaging system deflector 54 guides the electron beam to the detector 60.

The detector 60 detects the electron beam. By the detector 60 detecting the electron beam, the transmission electron microscope image (TEM image) can be acquired.

The exhaust device 70 exhausts inside the lens barrel, including the specimen chamber 40, and the preliminary exhaust chamber 42. In the lens barrel of the electron microscope 100, the electron beam source 10, the optical system 2 and the like are housed. The preliminary exhaust of the preliminary exhaust chamber 42 is performed using the exhaust device 70.

Preliminary exhausting refers to exhausting the preliminary exhaust chamber 42 from the atmospheric pressure to a predetermined pressure. In a case of loading the specimen S into the specimen chamber 40, the preliminary exhaust chamber 42 is set to the atmospheric pressure, and the specimen S, held by the specimen holder 30, is loaded into the preliminary exhaust chamber 42 first. Then in the state where the specimen S is positioned in the preliminary exhaust chamber 42, the preliminary exhaust chamber 42 is preliminarily exhausted using the exhaust device 70. When the pressure in the preliminary exhaust chamber 42 reaches the predetermined pressure, the vacuum gate valve 44 is opened and the specimen S is loaded into the specimen chamber 40. Thereby the specimen S can be loaded into the specimen chamber 40 without dropping the pressure inside the specimen chamber 40.

The control unit 80 controls each component constituting the electron microscope 100. The control unit 80 controls, for example, the electron beam source 10, the irradiation system deflector 20, the irradiation optical system 22, the irradiation system aperture device 24, the specimen holder transporting device 32, the specimen holder driving device 34, the vacuum gate valve 44, the imaging optical system 50, the imaging system aperture device 52, the imaging system deflector 54, the detector 60 and the exhaust device 70.

The control unit 80 includes a processor, such as a central processing unit (CPU), and storage devices such as a random access memory (RAM) and a read only memory (ROM). In the storage device, programs to perform various controls and data are stored. The function of the control unit 80 is implemented by the processor executing the programs. The control unit 80 may further include an operation unit that receives operation by the user, and a display unit that displays a captured TEM image and the like.

In the electron microscope 100, the irradiation optical system 22 irradiates the specimen S with the electron beams emitted from the electron beam source 10, and the imaging optical system 50 forms an image of the electron beam transmitted through the specimen S, whereby the TEM image is formed on the detector 60. Thereby the detector 60 can acquire the TEM image.

1.2. Operation

The electron microscope 100 can automatically load a specimen S into the specimen chamber 40, adjust the optical system 2, and adjust the detector 60.

Figure 3:
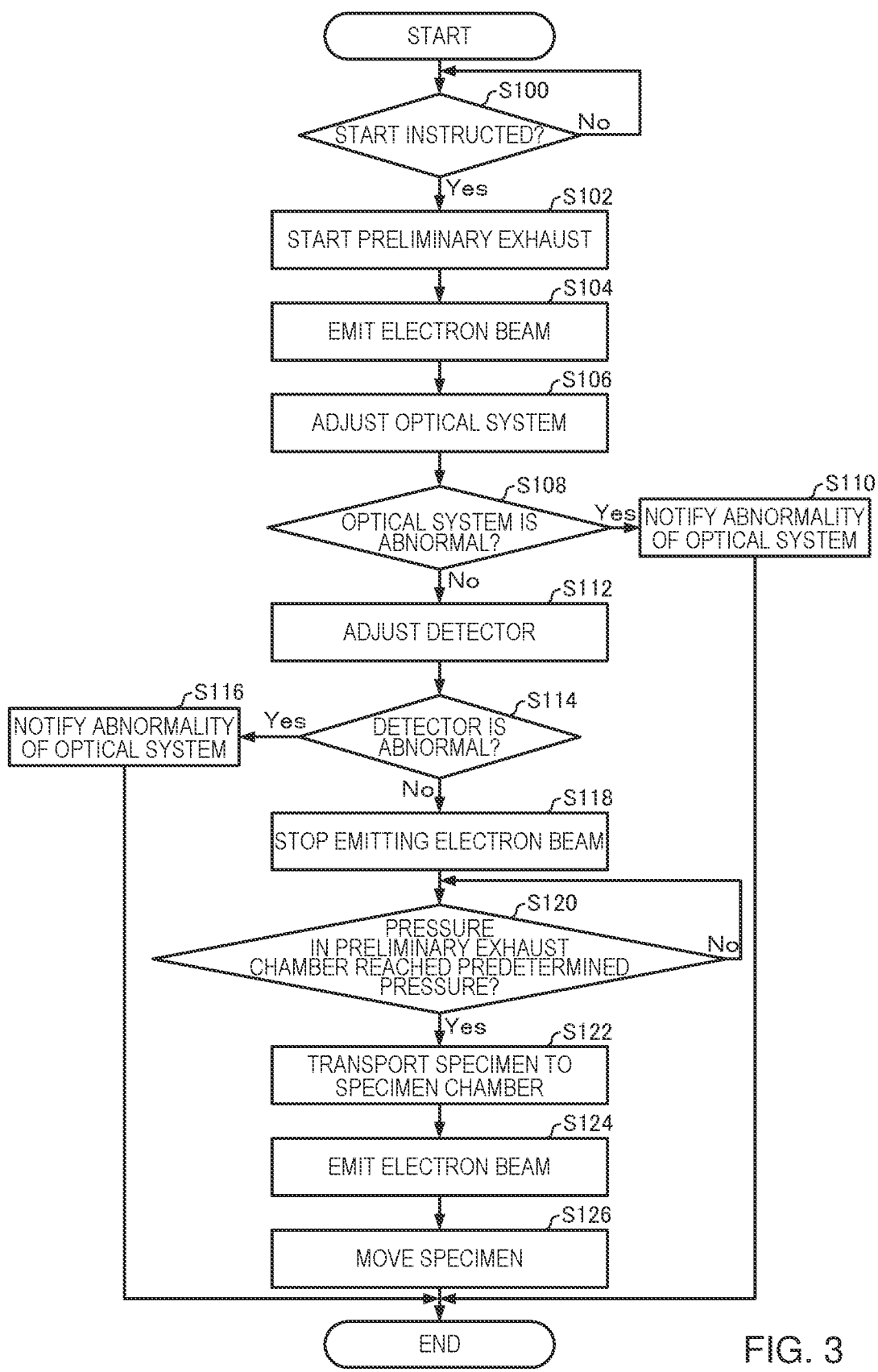
FIG. 3 is a flow chart illustrating an example of processing by a control unit of an electron microscope according to the first embodiment.

FIG. 3 is a flow chart illustrating an example of processing by the control unit 80 of the electron microscope 100.

First the user sets the specimen S on the specimen holder 30. Then the user introduces the specimen holder 30 into the preliminary exhaust chamber 42. Thereby the specimen S is loaded into the preliminary exhaust chamber 42, as illustrated in FIG. 1. In this state, the user inputs an instruction to start the preliminary exhausting of the preliminary exhaust chamber 42 via the operation unit.

When the control unit 80 receives the instruction to start the preliminary exhausting of the preliminary exhaust chamber 42, (Yes in S100), the control unit 80 starts the preliminary exhausting of the preliminary exhaust chamber 42 by operating the exhaust device 70 (S102).

Then the control unit 80 opens an electron gun gate valve (not illustrated) disposed in a subsequent stage of the electron beam source 10, and emits the electron beam (S104). Thereby the electron beam generated in the electron beam source 10 reaches the optical system 2 and the detector 60 in a subsequent stage of the electron beam source 10.

Then the control unit 80 starts adjusting the optical system 2 (S106). The adjustment processing to adjust the optical system 2 will be described in detail later.

In the case where the control unit 80 determines that the optical system 2 is abnormal in the adjustment processing of the optical system 2 (Yes in S108), the control unit 80 notifies the abnormality of the optical system 2 (S110). For example, the abnormality of the optical system 2 is notified by displaying a message on the display unit that the optical system 2 is abnormal. The control unit 80 ends the processing after the abnormality of the optical system 2 is notified.

In the case where the control unit 80 determines that the optical system 2 is not abnormal and adjustment of the optical system 2 ended normally (No in S108), the control unit 80 starts adjustment of the detector 60 (S112). The adjustment processing to adjust the detector 60 will be described in detail later.

In the case where the control unit 80 determines that the detector 60 is abnormal in the adjustment processing of the detector 60 (Yes in S114), the control unit 80 notifies the abnormality of the detector 60 (S116). For example, the abnormality of the detector 60 is notified by displaying a message on the display unit, that the detector 60 is abnormal. The control unit 80 ends the processing after the abnormality of the detector 60 is notified.

In the case where the control unit 80 determines that the detector 60 is not abnormal and adjustment of the detector 60 ended abnormally (No in S114), the control unit 80 closes the electron gun gate valve (not illustrated), and stops emission of the electron beam (S118).

The adjustment processing of the optical system 2 (S106) and the adjustment processing of the detector 60 (S112) are performed in parallel with the preliminary exhausting of the preliminary exhaust chamber 42. In other words, the adjustment processing of the optical system 2 and the adjustment processing of the detector 60 are performed while the exhaust device 70 is exhausting the preliminary exhaust chamber 42 from the atmospheric pressure to the predetermined pressure. In this way, in the electron microscope 100, the adjustment processing of the optical system 2 and the adjustment processing of the detector 60 are performed in the state where the specimen S is housed in the preliminary exhaust chamber 42.

While the case of performing the adjustment processing of the detector 60 after performing the adjustment processing of the optical system 2 was described above, the adjustment processing of the optical system 2 may be performed after the adjustment processing of the detector 60.

Then the control unit 80 acquires the information on the pressure inside the preliminary exhaust chamber 42 from the vacuum gauge that measures the pressure inside the preliminary exhaust chamber 42, and determines whether the pressure inside the preliminary exhaust chamber 42 reached a predetermined pressure (S120). The control unit 80 stands by until it is determined that the pressure inside the preliminary exhaust chamber 42 reached the predetermined pressure (No in S120).

In the case where the control unit 80 determines that the pressure inside the preliminary exhaust chamber 42 reached the predetermined pressure (Yes in S120), the control unit 80 opens the vacuum gate valve 44 and allows the specimen holder transporting device 32 to transport the specimen holder 30 to the specimen chamber 40 (S122). Thereby the specimen S held on the specimen holder 30 is moved from the preliminary exhaust chamber 42 to the specimen chamber 40, and the specimen S is transported to the specimen chamber 40.

After the specimen S is moved to the specimen chamber 40, the control unit 80 opens the electron gun gate valve and emits the electron beam to the specimen S (S124).

Then the control unit 80 operates the specimen holder driving device 34 and moves the specimen S to a predetermined observation position (S126). Thereby the electron microscope observation of the specimen S is enabled. Then the control unit 80 ends the processing.

It should be noted that a part of the above mentioned processing by the control unit 80 may be manually performed by the user.

Figure 4:
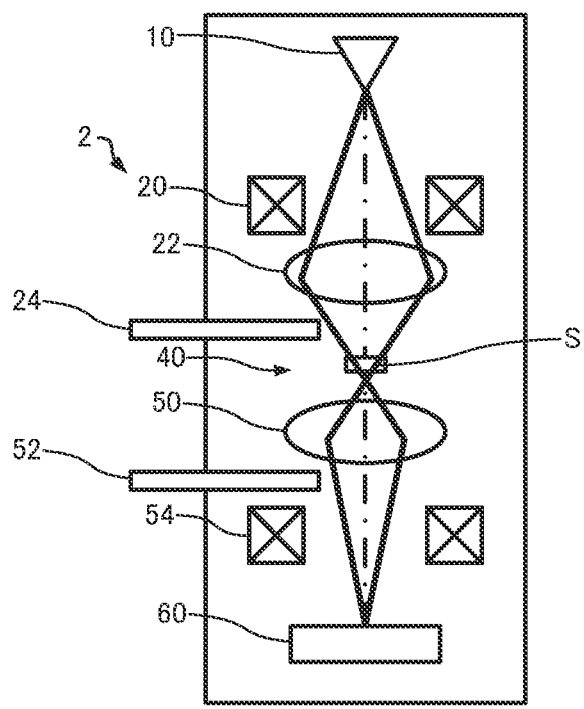
FIG. 4 is a diagram for explaining processing to confirm a state of an electron beam source.

1.3. Adjustment Processing of Optical System (1) Confirmation of State of Electron Beam Source FIG. 4 is a diagram for explaining processing to confirm a state of the electron beam source 10.

In the electron microscope 100, the state of the electron beam source 10 is confirmed before performing the adjustment processing of the optical system 2. Specifically, as illustrated in FIG. 4, the irradiation optical system 22, the irradiation system deflector 20, the imaging optical system 50 and the imaging system deflector 54 are set to a predetermined condition, and in a state where the aperture of the irradiation system aperture device 24 and the aperture of the imaging system aperture device 52 are outside the optical axis, the amount of the electron beam detected by the detector 60 is confirmed. If the electron beam is not detected, it is determined that the electron beam source 10 is abnormal.

(2) Adjustment of Irradiation Optical System

Figure 5:
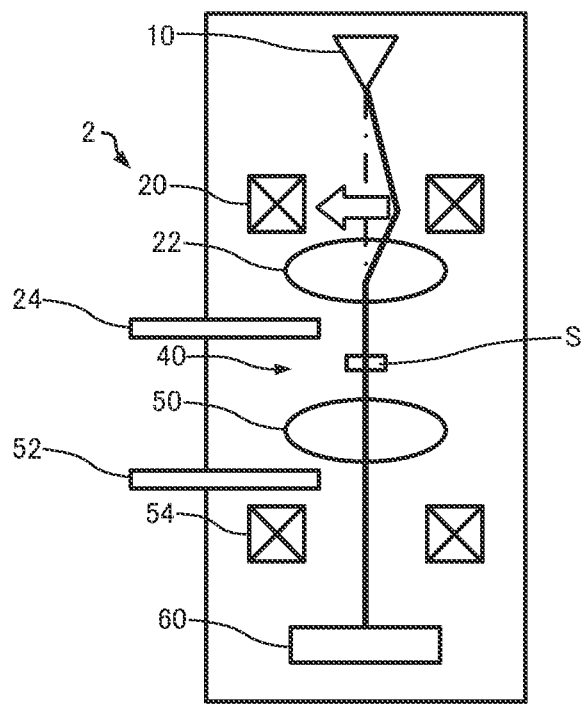
FIG. 5 is a diagram for explaining processing to adjust an irradiation optical system.

FIG. 5 is a diagram for explaining processing to adjust the irradiation optical system 22.

The irradiation optical system 22 is constituted of a plurality of electron lenses. The optical condition of the irradiation optical system 22 can be changed by changing the setting of the electron lenses constituting the irradiation optical system 22. For example, the irradiation optical system 22 is adjusted so that the electron beam is positioned at the center of the detector 60 (that is, on the optical axis), by changing the optical condition of the irradiation optical system 22.

Specifically, the imaging optical system 50 is set to a real image forming state first. Here the real image forming state refers to a state where a real image is formed at a predetermined magnification. Then, as illustrated in FIG. 5, the electron beam is positioned at the center of the detector 60 using the irradiation system deflector 20. The state of the irradiation system deflector 20 is stored for each optical condition of the irradiation optical system 22.

Then the imaging optical system 50 is set to a diffraction pattern image forming state. Here the diffraction pattern image forming state refers to a state where a diffraction pattern is acquired within a predetermined acquisition range. Then in the diffraction pattern image forming state, the electron beam is positioned at the center of the detector 60 using the irradiation system deflector 20. The state of the irradiation system deflector 20 is stored for each optical condition of the irradiation optical system 22.

The case where the position of the electron beam on the detector 60 moved when the acquisition range is changed in the diffraction pattern image forming state means that the electron beam is entering the specimen S from an inclined direction. Therefore the irradiation system deflector 20 is set so that the moving amount of the electron beam on the detector 60, when the diffraction pattern image forming state is changed, becomes the minimum. Thereby the inclination of the electron beam that enters the specimen S can be adjusted to be small.

The method of adjusting the inclination of the electron beam with respect to the specimen S is not limited to this. For example, the irradiation system deflector 20 may be set such that the moving amount of the electron beam on the detector 60 becomes the minimum when the energy of the electron beam is changed in the state where the imaging optical system 50 is set to the real image forming state. Thereby the inclination of the electron beam that enters the specimen S can be adjusted to be small.

While repeating this processing for a predetermined number of times, the adjustment of the irradiation optical system 22 ends when the electron beam is positioned at the center of the detector 60 in both the real image forming state and the diffraction pattern image forming state.

In the case where the electron beam is not positioned at the center of the detector 60 in at least one of the real image forming state and the diffraction pattern forming state, even if the above mentioned processing is repeated for a predetermined number of times, it is determined that the irradiation optical system 22 is abnormal.

(3) Adjustment of Imaging Optical System

Figure 6:
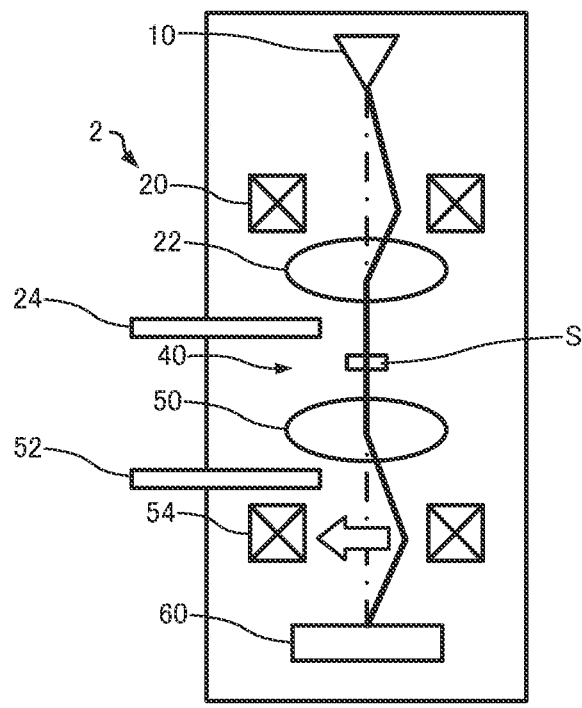
FIG. 6 is a diagram for explaining processing to adjust an imaging optical system.

FIG. 6 is a diagram for explaining processing to adjust the imaging optical system 50.

The imaging optical system 50 is constituted of a plurality of electron lenses, just like the irradiation optical system 22. The optical condition of the imaging optical system 50 can be changed by changing the setting of the electron lenses constituting the imaging optical system 50. For example, the imaging optical system 50 is adjusted so that the electron beam is positioned at the center of the detector 60, even if the optical condition of the imaging optical system 50 is changed.

Specifically, as illustrated in FIG. 6, the imaging system deflector 54 is set such that the electron beam is positioned at the center of the detector 60, even if the optical condition of the imaging optical system 50 is changed. The state of the imaging system deflector 54 is stored for each optical condition of the imaging optical system 50.

In the case where this processing cannot be completed, that is, in the case where the imaging system deflector 54 cannot be set such that the electron beam is positioned at the center of the detector 60, even if the optical condition of the imaging optical system 50 is changed, it is determined that the imaging optical system 50 is abnormal.

(4) Adjustment of Irradiation System Aperture Device

Figure 7:
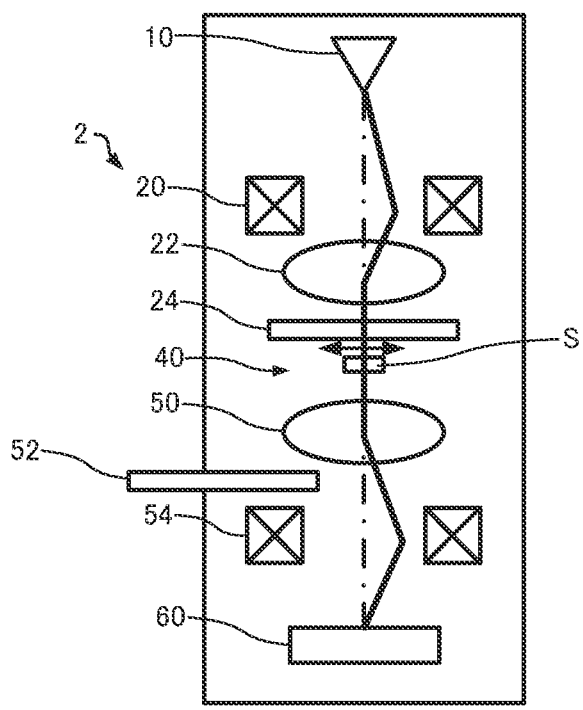
FIG. 7 is a diagram for explaining processing to adjust an irradiation system aperture device.

FIG. 7 is a diagram for explaining processing to adjust the irradiation system aperture device 24.

The irradiation system aperture device 24 is adjusted so that the center of the aperture hole is positioned on the optical axis.

Specifically, first the irradiation optical system 22 is set to a predetermined condition, and the imaging optical system 50 is set to the real image forming state. Then the aperture of the irradiation system aperture device 24 is moved onto the optical axis. Then as illustrated in FIG. 7, the driving mechanism of the irradiation system aperture device 24 is operated so that the center of the aperture hole is positioned at the center of the detector 60. The adjustment of the irradiation system aperture device 24 is performed for each aperture hole, and the position of the aperture is stored for each aperture hole.

In the case where this processing cannot be completed, it is determined that the irradiation system aperture device 24 is abnormal.

(5) Adjustment of Imaging System Aperture Device

Figure 8:
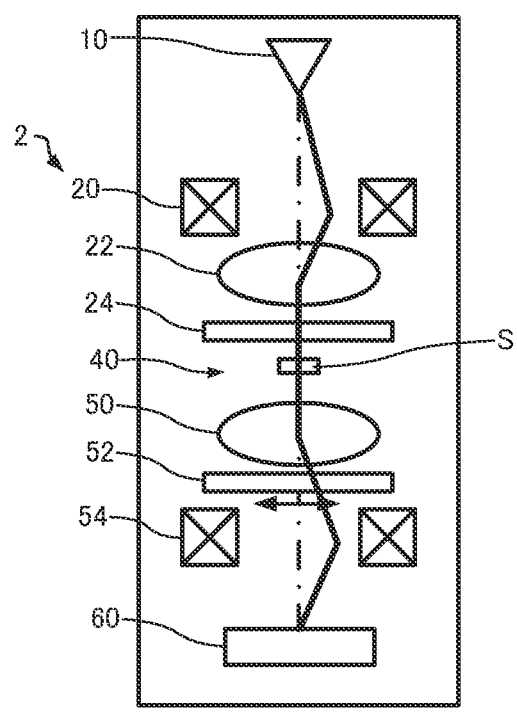
FIG. 8 is a diagram for explaining processing to adjust an imaging system aperture device.

FIG. 8 is a diagram for explaining the processing to adjust the imaging system aperture device 52.

The imaging system aperture device 52 is adjusted so that the center of the aperture hole is positioned on the optical axis.

Specifically, first the irradiation optical system 22 is set to a predetermined condition, and the imaging optical system 50 is set to the real image forming state. Then the aperture of the imaging system aperture device 52 is moved onto the optical axis. Then as illustrated in FIG. 8, the driving mechanism of the imaging system aperture device 52 is operated so that the center of the aperture hole is positioned at the center of the detector 60. The adjustment of the imaging system aperture device 52 is performed for each aperture hole if there are a plurality of aperture holes, and the position of the aperture is stored for each aperture hole.

In the case where this processing cannot be completed, it is determined that the imaging system aperture device 52 is abnormal.

1.4. Adjustment of Processing of Detector

The detector 60 is adjusted so that the electron beam can be detected normally.

Specifically, first the electron gun gate valve is closed so that the electron beam does not reach the detector 60. The amount of the electron beam detected by the detector 60 at this time is recorded as the background B.

Then the electron gun gate valve is opened, the irradiation optical system 22 is set to a predetermined condition, and the imaging optical system 50 is set to the real image forming state. Further, the aperture of the irradiation system aperture device 24 and the aperture of the imaging system aperture device 52 are set to be away from the optical axis. The distribution of the amount of the electron beam on the detector surface detected by the detector 60, when the optical system 2 is set to the state illustrated in FIG. 4, is recorded as a gain distribution G.

In the case where this processing cannot be completed, it is determined that the detector 60 is abnormal.

According to the electron microscope 100, in the case of acquiring a TEM image by detecting the electron beam using the detector 60, the processing to determine $(S-B)/G$ is performed for the detected amount S, whereby the background with respect to the signal from the detector 60, and the artifact detected by the gain distribution can be corrected.

While the adjustment of the irradiation optical system 22, the adjustment of the imaging optical system 50, the adjustment of the irradiation system aperture device 24 and the adjustment of the imaging system aperture device 52 were described above as the adjustment processing of the optical system 2 (S106), it should be noted that all of these adjustments may be performed or a part of these adjustments may be performed in the adjustment processing of the optical system 2. Furthermore, while a case of performing the adjustment processing of the optical system 2 (S106) and the adjustment processing of the detector 60 (S112) was described above, it should be noted that only the adjustment processing of the detector 60 may be performed without performing the adjustment processing of the optical system 2, or only the adjustment processing of the optical system 2 may be performed without performing the adjustment processing of the detector 60.

1.5 Functional Effect

In the electron microscope 100, in the state where the sample S is housed in the preliminary exhaust chamber 42, the control unit 80 performs the adjacent processing in which at least one of the optical system 2 and the detector 60 is adjusted, and after the adjustment processing, the control unit 80 performs the transporting processing in which the vacuum gate valve 44 is opened, and the specimen holder transporting device 32 transports the specimen S to the specimen chamber 40. In the electron microscope 100, the adjustment processing can be performed while the specimen S is housed in the preliminary exhaust chamber 42, hence observation and analysis can be performed quickly after the specimen S is loaded into the specimen chamber 40.

Further, in the electron microscope 100, the adjustment of the optical system 2 and the adjustment of the detector 60 are performed in the state where the specimen S is housed in the preliminary exhaust chamber 42, hence in the case where the electron beam is emitted to the specimen S and the electron beam is not detected by the detector 60, it is determined that this is due to the influence of the specimen S or the specimen holder 30.

In the case where the detector 60 cannot detect the electron beam in the state where the specimen S is loaded into the specimen chamber 40, for example, it is difficult to determine whether the electron beam is not detected due to the influence of the specimen S or the specimen holder 30, or the electron beam is not detected because the optical system 2 or the detector 60 is not operating normally.

Also, in the case of performing the adjustment of the optical system 2 and the adjustment of the detector 60 in the state where the specimen S is loaded into the specimen chamber 40, for example, unnecessary damage may be applied to the specimen S. It may be possible to perform the adjustment after moving the specimen S to a position where the specimen S is not irradiated with the electron beam, but an extra step of moving the specimen S is required.

In the electron microscope 100, the adjustment of the optical system 2 and the adjustment of the detector 60 are performed in a state where the specimen S is housed in the preliminary exhaust chamber 42, hence the above mentioned problem does not occur.

In the electron microscope 100, the adjustment of the detector 60 is performed in the state where the specimen is housed in the preliminary exhaust chamber 42, hence the influence of the background of the detector 60 and the artifact generated by the gain distribution can be corrected with certainty.

In the electron microscope 100, the control unit 80 performs the preliminary exhaust processing to allow the exhaust device 70 to preliminarily exhaust the preliminary exhaust chamber 42, and this preliminary exhaust processing and the adjustment processing are performed in parallel. Therefore compared with the case of performing the adjustment processing after performing the preliminary exhausting of the preliminary exhaust chamber 42, the time from setting the specimen S on the specimen holder 30 to performing the observation and analysis of the specimen S can be decreased. Therefore observation and analysis of the specimen S can be performed quickly.

In the electron microscope 100, in the case where the control unit 80 receives an instruction to start the preliminary exhaust processing, the control unit 80 starts the preliminary exhaust processing and the adjustment processing. Therefore observation and analysis of the specimen S can be performed quickly.

The adjustment method for the electron microscope 100 according to the first embodiment includes: an adjustment step in which at least one of the optical system 2 and the detector 60 is adjusted in the state where the specimen S is housed in the preliminary exhaust chamber 42; and a transporting step which is performed after the adjustment step and in which the vacuum gate valve 44 is opened and the specimen S is transported to the specimen chamber 40. Therefore observation and analysis can be performed quickly after the specimen S is loaded into the specimen chamber 40. Further, the adjustment method for the electron microscope 100 according to the first embodiment includes a preliminary exhausting step in which the exhaust device 70 preliminarily exhausts the preliminary exhaust chamber 42, and the preliminary exhausting step and the adjustment step are executed in parallel. Therefore the time from setting the specimen S on the specimen holder 30 to performing observation and analysis of the specimen S can be decreased.

2. Second Embodiment

2.1. Electron Microscope

Figure 9:
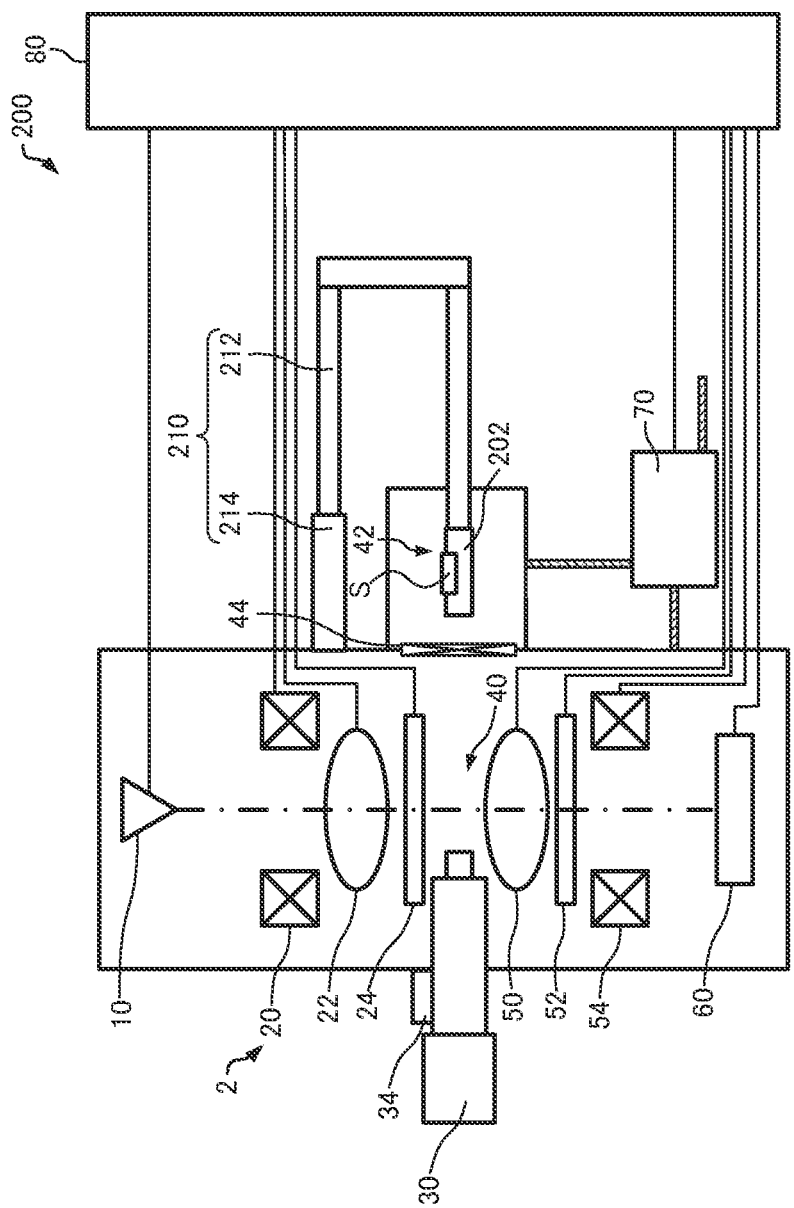
FIG. 9 is a diagram illustrating a configuration of an electron microscope according to the second embodiment.
Figure 10:
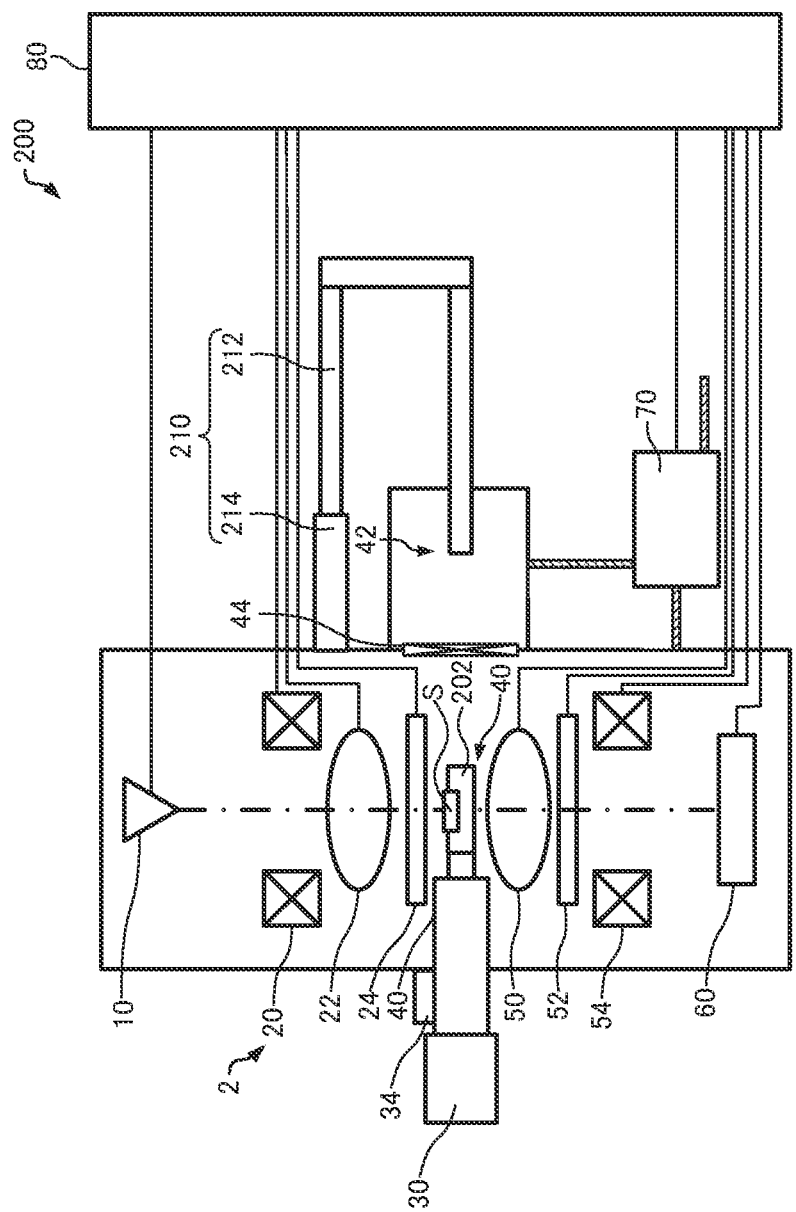
FIG. 10 is a diagram illustrating a configuration of an electron microscope according to the second embodiment.

An electron microscope according to the second embodiment will be described with reference to the drawings. FIG. 9 and FIG. 10 are diagrams illustrating a configuration of an electron microscope 200 according to the second embodiment. FIG. 9 indicates a state where a specimen S is positioned in the preliminary exhaust chamber 42, and FIG. 10 indicates a state where the specimen S is positioned in the specimen chamber 40.

In the electron microscope 200 according to the second embodiment, a component having the same function as a composing member of the electron microscope 100 according to the first embodiment is denoted with the same reference sign, and detailed description thereof will be omitted.

As illustrated in FIG. 9 and FIG. 10, the electron microscope 200 includes a retainer 202 that holds a specimen S and a retainer transporting device 210.

The retainer 202 includes a mechanism that holds the specimen S. The retainer 202 is installed in the retainer transporting device 210.

The retainer transporting device 210 transports the retainer 202. The retainer transporting device 210 moves the specimen S held on the retainer 202 between the preliminary exhaust chamber 42 and the specimen chamber 40 by transporting the retainer 202. The retainer transporting device 210 includes a support unit 212 that supports the retainer 202, and a driving unit 214 that moves the support unit 212. The driving unit 214 is an actuator, such as an air cylinder, for example. The retainer transporting device 210 functions as a transporting device that transports the specimen S from the preliminary exhaust chamber 42 to the specimen chamber 40. The retainer transporting device 210 is controlled by the control unit 80.

In the electron microscope 200, the retainer 202 is installed in the specimen holder 30 in the specimen chamber 40.

2.2. Operation of Electron Microscope

In the electron microscope 200, loading of the specimen S to the specimen chamber 40, adjustment of the optical system 2 and adjustment of the detector 60 can be performed automatically.

First the user sets the specimen S on the retainer 202. Then the user installs the retainer 202 in the support unit 212 of the retainer transporting device 210, and loads the retainer 202 into the preliminary exhaust chamber 42. Thereby the specimen S is housed in the preliminary exhaust chamber 42. In this state, the user inputs the instruction to start the preliminary exhaust of the preliminary exhaust chamber 42.

The processing by the control unit 80 is the same as the processing described with reference to FIG. 3 and the transporting processing to transport the specimen S from the preliminary exhaust chamber 42 to the specimen chamber 40 (S122), except that the retainer transporting device 210 transports the retainer 202 from the preliminary exhaust chamber 42 to the specimen chamber 40, and the retainer 202 is installed in the specimen holder 30 in the specimen chamber 40, hence description of this processing is omitted.

2.3. Functional Effect

In the electron microscope 200, the functional effect similar to the above mentioned electron microscope 100 can be implemented.

3. Other

The invention is not limited to the embodiments described above, and various modifications can be made within the scope of the invention.

While a case where the charged particle beam apparatus according to the invention is the transmission electron microscope was described in the first embodiment and the second embodiment, the charged particle beam apparatus according to the invention is not limited to a transmission electron microscope in particular, and may be any charged particle beam apparatus that includes a specimen chamber which is maintained at vacuum and in which a specimen is disposed, and a preliminary exhaust chamber that is connected to the specimen chamber via the vacuum gate valve. Examples of such a charged particle beam apparatus are a scanning transmission electron microscope, a scanning electron microscope, and a focused ion beam apparatus.

The invention is not limited to the above mentioned embodiments, and various other modifications can be made. For example, the invention includes configurations that are substantially the same as the configurations described in the embodiments. Substantially same configurations means configurations that are the same in function, method, and results, or configurations that are the same in objective and effects, for example. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A charged particle beam apparatus comprising:
   a specimen chamber which is maintained at vacuum and in which a specimen is disposed;
   a preliminary exhaust chamber that is connected to the specimen chamber via a vacuum gate valve;
   an exhaust device that exhausts the preliminary exhaust chamber;
   a charged particle beam source;
   an optical system;
   a detector;
   a transporting device that transports the specimen from the preliminary exhaust chamber to the specimen chamber; and
   a control unit that controls the exhaust device, the optical system, the detector and the transporting device, wherein
   the control unit performs:
      adjustment processing in which at least one of the optical system and the detector is adjusted in a state where the specimen is housed in the preliminary exhaust chamber; and
      transporting processing which is performed after the adjustment processing and in which the vacuum gate valve is opened and the transporting device transports the specimen to the specimen chamber,
   wherein the control unit performs preliminary exhaust processing in which the exhaust device preliminarily exhausts the preliminary exhaust chamber, and
   the preliminary exhaust processing and the adjustment processing are performed in parallel, and
   wherein a charged particle beam emitted from the charged particle beam source is used in the adjustment processing.

2. The charged particle beam apparatus according to claim 1, wherein
   the control unit starts the preliminary exhaust processing and the adjustment processing when the control unit has received an instruction to start the preliminary exhaust processing.

3. An adjustment method for a charged particle beam apparatus, the charged particle beam apparatus comprising:
   a specimen chamber which is maintained at vacuum and in which a specimen is disposed;
   a preliminary exhaust chamber that is connected to the specimen chamber via a vacuum gate valve;
   an exhaust device that exhausts the preliminary exhaust chamber;
   a charged particle beam source;
   an optical system;
   a detector; and
   a transporting device that transports the specimen from the preliminary exhaust chamber to the specimen chamber,
   the adjustment method comprising:
      a preliminary exhaust step in which the exhaust device preliminarily exhausts the preliminary exhaust chamber;
      an adjustment step in which at least one of the optical system and the detector is adjusted in a state where the specimen is housed in the preliminary exhaust chamber; and
      a transporting step which is performed after the adjustment step and in which the vacuum gate valve is opened and the specimen is transported to the specimen chamber,
   wherein the preliminary exhaust step and the adjustment step are performed in parallel, and
   wherein a charged particle beam emitted from the charged particle beam source is used in the adjustment step.

* * * * *